United States Patent
Yoo

(10) Patent No.: US 8,941,555 B2
(45) Date of Patent: Jan. 27, 2015

(54) ORGANIC LIGHT EMITTING DISPLAY DEVICE AND METHOD FOR MANUFACTURING THE SAME

(71) Applicant: LG Display Co., Ltd., Seoul (KR)

(72) Inventor: Choong-Keun Yoo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 146 days.

(21) Appl. No.: 13/711,774

(22) Filed: Dec. 12, 2012

(65) Prior Publication Data
US 2014/0002331 A1  Jan. 2, 2014

(30) Foreign Application Priority Data
Jun. 29, 2012  (KR) .................. 10-2012-0071207

(51) Int. Cl.
G09G 3/32  (2006.01)

(52) U.S. Cl.
CPC .................. G09G 3/3208 (2013.01)
USPC .................. 345/1.1; 345/76

(58) Field of Classification Search
CPC .................. G09G 2380/02
See application file for complete search history.

(56) References Cited

U.S. PATENT DOCUMENTS

| | | | |
|---|---|---|---|
| 6,177,912 B1 * | 1/2001 | Izumi | 345/1.3 |
| 8,624,275 B2 * | 1/2014 | Matsushima | 257/89 |
| 2003/0156074 A1 * | 8/2003 | Ranganathan et al. | 345/1.1 |
| 2010/0201275 A1 * | 8/2010 | Cok et al. | 315/158 |
| 2011/0285607 A1 * | 11/2011 | Kim | 345/1.3 |
| 2012/0013602 A1 * | 1/2012 | Lee et al. | 345/419 |
| 2013/0076649 A1 * | 3/2013 | Myers et al. | 345/173 |

* cited by examiner

*Primary Examiner* — Nicholas Lee
*Assistant Examiner* — Duane N Taylor, Jr.
(74) *Attorney, Agent, or Firm* — Morgan, Lewis & Bockius LLP

(57) ABSTRACT

An organic light emitting display device (OLED) includes: a multiple display in which a plurality of panels operate as a single display, wherein each of the panels comprise a substrate and a pixel; and a polarizing plate attached to the multiple display to bond the plurality of panels as a single panel, wherein the panels are divided into (i) display areas in which pixels are formed, and (ii) non-display areas surrounding the display areas, and at least two adjacent panels at an interpanel boundary are folded in the adjacent non-display areas to reduce the non-display areas.

20 Claims, 6 Drawing Sheets

ORGANIC LIGHT EMITTING DISPLAY DEVICE AND METHOD FOR MANUFACTURING THE SAME

The present application claims the priority benefit of Korean Patent Application No. 10-2012-0071207 filed in Republic of Korea on Jun. 29, 2012, which is hereby incorporated by reference in its entirety.

BACKGROUND

1. Field of the Disclosure

The present disclosure relates to an organic light emitting display device, and more particularly, to an organic light emitting display device capable of being implemented in a large area and a method of fabricating the same.

2. Discussion of the Related Art

Developments in information have led to developments in portable electronic apparatus such as a computer, a mobile phone, a notebook computer, etc., and demand for thinner and lighter flat panel display devices has increased. In addition, demand for large-sized flat panel display devices has increased. And, the constant demand for large-area display devices, such as a signboard, or for notice boards in public spaces, such as subway stations, bus stations or in outdoor locations, has increased.

The flat panel display device includes a liquid crystal display (LCD), a plasma display panel (PDP), a field emission display (FED) and an organic light emitting diode device (OLED).

Among them, the OLED exhibits a high response rate, a great contrast ratio, a great viewing angle, and low power consumption, and thus research aimed at developing as the next-generation display, in particular, a large-area display, has been underway.

Techniques of fabricating a large-area OLED may include an application of a color filter to an OLED emitting white light, a laser induced thermal imaging (LITI) method of transferring a laser to deposit an emission material of each color on a substrate, and a small mask scanning method of performing scanning of a small mask, all of which have failed in mass production.

The panel that has been released is available up to 55 inches, and fabrication of a 100-inch panel has not even been considered.

In order to implement a large-area OLED, a multiple panel technique in which a plurality of display panels are coupled to fabricate a single module has been on the rise. FIG. 1 is a view of a large-area OLED to which a general multiple panel technique is applied.

An organic light emitting diode device (OLED) illustrated in FIG. 1 includes a multiple display 100 including first and second panels 110 and 120. Each of the panels 110 and 120 includes a display area AA including pixel parts PXA and a non-display area NA surrounding the display area AA on a substrate 140. The non-display area NA of the first panel 110 is in contact with the non-display area NA of the second panel 120, and a polarizing plate 130 is coupled on the pixel part PXA, so that the first and second panels are coupled to each other. The non-display areas NA constituting a periphery of the panels 110 and 120 are divided into areas that are in contact with the other panels and are not in contact with the other panels, and the non-display areas NA that are not in contact with the other panels include a gate pad part (not shown) and a data pad part (not shown), so that a gate driving circuit part (not shown) and a data driving circuit part (not shown) may be mounted thereon. The non-display areas NA that are in contact with the other panels form a region that does not emit light in the multiple display 100 driving a single screen, which is referred to as a seam phenomenon. Therefore, when the general multiple panel technique is applied, brightness uniformity is deteriorated, and each coupled panel appears to be cut off, so that a natural single image may not be implemented.

Accordingly, viewers may feel uncomfortable when watching the screen.

SUMMARY OF THE INVENTION

The present invention in one aspect is directed to an organic light emitting display device (OLED) in which a plurality of panels are coupled to constitute a single large-area panel, and a single image is implemented without being cut off.

One of the objects of the present disclosure is to provide an OLED having a multiple display in which a plurality of panels operate as a single display, and a polarizing plate attached to the multiple display to bond the plurality of panels as one panel. In some embodiments, the panels are divided into (i) display areas in which pixels are formed, and (ii) non-display areas surrounding the display areas, some of which are disposed in the multiple display and folded to be in contact with each other. In some embodiments, the present disclose includes a multiple display in which a plurality of panels operate as a single display, wherein each of the panels comprise a substrate and a pixel; and a polarizing plate attached to the multiple display to bond the plurality of panels as a single panel, wherein the panels are divided into (i) display areas in which pixels are formed, and (ii) non-display areas surrounding the display areas, and at least two adjacent panels at an interpanel boundary are folded in the adjacent non-display areas to reduce the non-display areas.

Another object of the present disclosure is to provide a method of fabricating an organic light emitting display device (OLED) including forming a second substrate on a first substrate, dividing the second substrate into display areas and non-display areas surrounding the display areas, and forming a plurality of pixels including sub-pixels in the display areas, separating the first substrate from the second substrate to form panels, folding the non-display area of each panel by having a plurality of panels, causing the non-display areas of the plurality of panels to be in contact with each other, and coupling a polarizing plate to the plurality of panels to form a multiple display.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention. In the drawings.

DETAILED DESCRIPTION OF EMBODIMENTS

Reference will be made in detail to the exemplary embodiments, examples of which are illustrated in the accompanying drawings.

Figure 1:
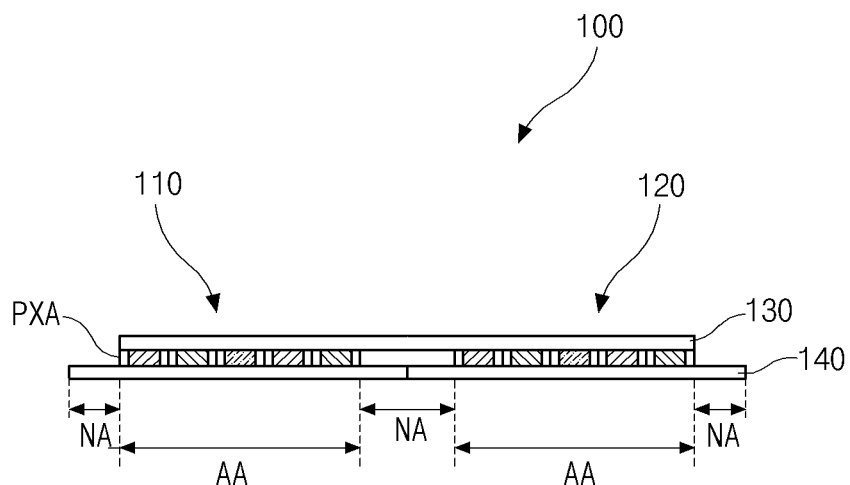
FIG. 1 is a cross-sectional view of an exemplary large-size organic light emitting display device (OLED) to which a general multiple panel technique is applied.
Figure 2:
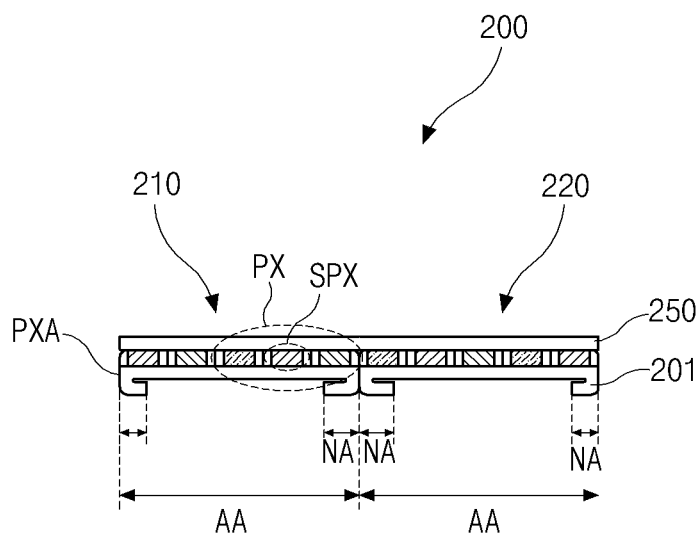
FIG. 2 is a cross-sectional view of an OLED according to one embodiment of the present invention.

FIG. 2 is a cross-sectional view of an organic light emitting display device (OLED) according to one embodiment of the present invention.

As illustrated in FIG. 2, the OLED according to one embodiment of the present invention includes first and second panels 210 and 220. While two panels are exemplified in the embodiment of the present invention, actually, two or more panels may be applicable.

Each of the plurality of panels 210 and 220 is divided into display areas AA in which pixel parts PXA are formed and non-display areas NA surrounding the display areas AA. A polarizing plate 250 is attached to the pixel part PXA formed in each of the panels 210 and 220, so that the plurality of panels 210 and 220 are connected as a multiple display 200. The panels in the non-display areas NA at a region at which the panels 210 and 220 are in contact with each other are folded at a right angle or at any of various angles to be in contact with each other. The direction in which they are folded may be opposite to the polarizing plate 250.

Ends of the folded panels in the non-display areas NA may be in contact with a lower part of each of the panels 210 and 220. The degree to which the panel is folded is not limited to the description.

Also, a gate pad part that is an end of a gate line (not shown) and a data pad part that is an end of a data line (not shown) are formed in the non-display areas NA in a region in which the panels 210 and 220 are not in contact with each other, so that a gate driving circuit part (not shown) and a data driving circuit (not shown) may be mounted thereon. The panel in the other non-display area NA in the region in which the panels 210 and 220 are not in contact with each other may be downwardly folded within a range of which the gate pad part and the data pad part (not shown) are not damaged, and this may minimize bezel. The ends of the non-display areas NA in the region in which the panels 210 and 220 are not in contact with each other may be in contact with a lower part of each of the panels 210 and 220. However, a degree to which the panel in the non-display area NA is folded is not limited to the description.

Unlike a conventional substrate, a flexible material is used as the substrate 201 on which the pixel parts PXA of the panels 210 and 220 are formed. The flexible material can be any flexible material that can be bent at an angle and, for example, may comprise polyimide (PI).

The pixel part PXA may bes formed in the display areas AA of the panels 210 and 220. The pixel part PXA includes a plurality of pixels, and the pixel PX may consist of sub-pixels (SPX) that emit different colors (e.g. red, green, blue, yellow, cyan, deep blue, light blue) or more. The sub-pixels (SPX) may be defined by intersecting the gate line and the data line, and may include a driving device, an emission device and an encapsulating part. The driving device including a switching thin film transistor and a driving thin film transistor may be formed on the substrate, and at the same time, the gate line and the data line may be formed thereon. In addition, a supply power line (not shown), the gate pad part and the data pad part may be formed thereon as well.

The emission device formed of an organic material is formed on the driving device. The emission device may be differently formed according to a driving type. For example, it may be formed as an RGB type in which emission devices of red, green and blue may independently emit light or a WRGB type in which white light emitted by a white emission device passes through color filters of red, green and blue, and different colors are emitted. Furthermore, the sub-pixel part emitting yellow, cyan and magenta light may be further added.

The encapsulation part is referred to as an encapsulation, and is abbreviated to be referred to as Encap. Also, currently, a plurality of thin films are formed as a multiple-layer structure to be referred to as a thin film encapsulation (TFE).

Since an emission layer of the OLED is formed of an organic material, it is vulnerable to air and moisture compared to an inorganic material, such as a metal. In order to protect the device from external air and moisture, the encapsulation part may be formed on the emission device, and an inorganic/organic multiple-layered structure in which an inorganic material layer and an organic material layer are repeated or a multiple structure formed of the same inorganic material layer or different kinds of inorganic material layers may be formed. The inorganic material includes, for example, a metal oxide, such as alumina ($Al_2O_3$), and silicon-based or oxide-based oxide, such as silicon nitride ($SiN_x$), silicon oxide ($SiO_2$), etc., and the organic material may include a monomer, a polyimide, a polyamide, and a polymer.

The sub-pixel SPX illustrated in FIG. 2 includes the driving device, the emission device and the encapsulation part, and all or a part of the elements constituting the sub-pixel SPX may be formed in the non-display area NA. Such a sub-pixel SPX is referred to as a dummy pixel. In particular, because the emission device or encapsulation part is formed mostly on the entire surface of the substrate 201 without an open mask or mask, it may be formed in the non-display area NA surrounding the display area AA.

Figure 3:
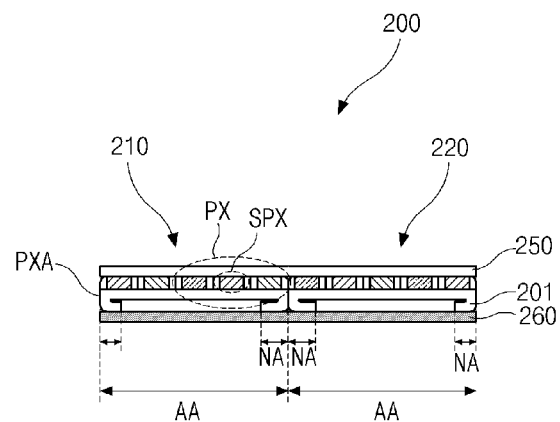
FIG. 3 is a cross-sectional view of an OLED according to another embodiment of the present invention.

FIG. 3 is a cross-sectional view of an OLED according to another embodiment of the present invention.

As illustrated in FIG. 3, the OLED according to another embodiment of the present invention further includes a support part 260 enhancing binding force between the panels 210 and 220 at a lower part of the multiple display 200.

The only force supporting the binding between panels 210 and 220 is the upwardly applied adhesive strength of the polarizing plate 250, and thus the binding force at the lower part of the panels 210 and 220 may be weak. In order to increase the force, the support part 260 is formed at the lower part of the multiple display 200 (i) to enhance the binding force between the panels 210 and 220, (ii) to interpose the gate driving circuit part and the data driving circuit part between the multiple display 200 and the support part 260, and/or (iii) to enable a space on which various auxiliary apparatus capable of enhancing performance of the OLED may be mounted to be formed.

Figure 4:
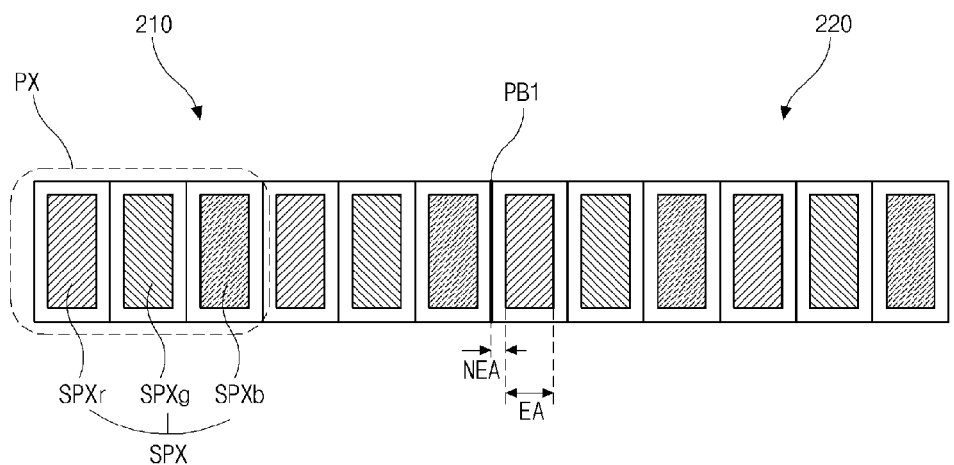
FIG. 4 is a plan view of an OLED in which an arrangement of a pixel part PXA is illustrated according to another embodiment of the present invention.

FIG. 4 is a plan view of an OLED in which an arrangement of a pixel part PXA is illustrated according to one embodiment of the present invention.

Figure 5:
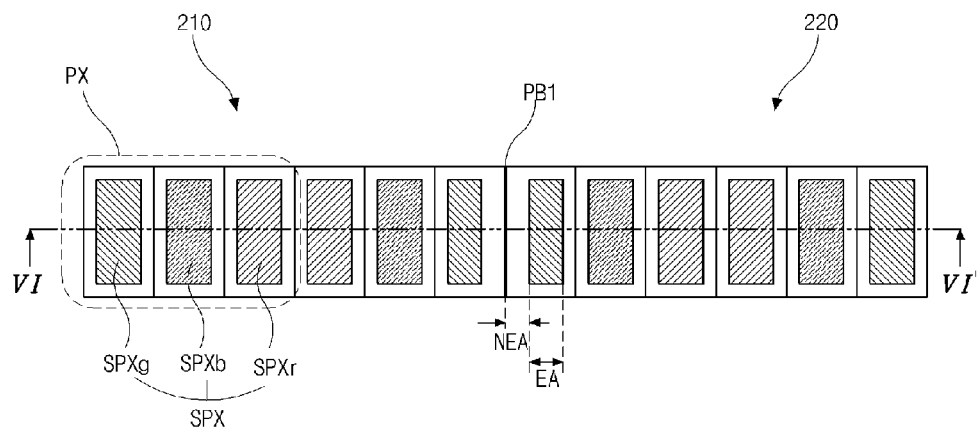
FIG. 5 is a plan view of an OLED in which an arrangement of a pixel part PXA is illustrated according to another embodiment of the present invention.

As illustrated in FIG. 4, the pixel part PXA includes a plurality of pixels PX having a sub-pixel SPX of three colors (e.g. RGB) or more. For example, as shown in FIG. 4, the pixel PX may include the sub-pixels SPXr, SPXg, and SPXb of red, green and blue, which are sequentially arranged therein. Also, each of the sub-pixel SPX may have the same emission area EA size, and the adjacent sub-pixels SPX may have different colors. In further embodiments, each of the non-emission area NEA surrounding the emission area may have the same size. In additional embodiments, the sub-pixels SPXs may have different emission area EA sizes, and the non-emission areas NEAs surrounding the emission area may have different sizes. The arrangement of the pixels PX may be made in the same order in the entire area of the multiple display 200, and the order of the arrangement in an interpanel boundary PB1 may be fixed. Otherwise, brightness uniformity of the entire screen may bes deteriorated, and a problem with visibility may occur. FIG. 5 illustrates an arrangement of sub-pixels SPX in another type.

FIG. 5 is a plan view of an OLED in which an arrangement of a pixel part PXA is illustrated according to another embodiment of the present invention.

As illustrated in FIG. 5, for example, the pixel part PXA may include a plurality of pixels PX having sub-pixels SPXr, SPXg and SPXb of red, green and blue. In the exemplary pixel PX in FIG. 5, sub-pixels SPXg, SPXb and SPXr emitting green, blue and red, respectively, are sequentially arranged, and the sub-pixels SPXr and SPXg emitting red and green light are adjacent to each other. For example, as shown in FIG. 5, the green sub-pixel part SPXg formed at the first interpanel boundary PB1, i.e., the different panels 210 and 220 adjacent to each other with the non-display area NA interposed therebetween, is characterized by having a small emission area compared with the sub-pixels SPXr and SPXb of the other colors. This is because, since the panel in the non-display area NA is folded so that adjacent areas of the adjacent pixels are partially bent and damaged, the emission area of the outermost sub-pixel at the interpanel boundary is reduced at the interpanel boundary side to accommodate the folding as shown in FIG. 5.

When an emission area of an outermost sub-pixel at the interpanel boundary is damaged, a unit pixel including the sub-pixel as well as the corresponding sub-pixel does not express the exact gradation, pixels that do not emit light or display abnormal images increase, and thus a problem with visibility may occur. Therefore, the sub-pixel SPX formed at the outermost of the panels 210 and 220 and contacting the first interpanel boundary PB1 may be formed to have a smaller emission area size than the other sub-pixels SPX. The sub-pixel SPX having a smaller emission area size than the other sub-pixels SPX is not limited to the green sub-pixel SPXg, and the sub-pixels SPX emitting other colors may be applicable. In additional embodiments, the sub-pixel SPX formed at the outermost of the panels 210 and 220 and contacting the first interpanel boundary PB 1 may be formed to have an emission area shifted to the opposite side of the interpanel boundary compared to the emission areas of the other sub-pixels SPX.

In some embodiments, the green sub-pixel SPXg exhibits superior emission efficiency to the sub-pixels SPXr and SPXb of the other colors. Thus, even when the emission area of the sub-pixel SPXg is formed smaller than those of the sub-pixels SPXr and SPXb of the other colors, it may not exhibit any difference from the sub-pixels SPXr and SPXb in terms of lifespan and/or implementation of exact gradation. Therefore, the green sub-pixel SPXg may be formed as each of the sub-pixels SPX that are formed in the different panels 210 and 220 adjacent to each other with the first interpanel boundary PB1 interposed therebetween. Again, however, the sub-pixel SPX having a smaller emission area size than the other sub-pixels SPX is not limited to the green sub-pixel SPXg, and the sub-pixels SPX emitting other colors may be applicable.

In some embodiments, when an arrangement of the pixels PX is not consistent, and the order of the arrangement is changed in the middle, for example, as shown in FIG. 5, a problem with visibility may occur, and brightness uniformity may be deteriorated. Therefore, when one particular color sub-pixel SPX has a superior brightness, such a color sub-pixel SPX may be placed at the outermost portion to compensate for the smaller emission area of the sub-pixel SPX. For example, the pixels PX may be arranged in the order of the red, blue and green sub-pixels SPXr, SPXb and SPXg with the green sub-pixel SPXg at the outermost portion as shown in FIG. 5. However, the order of the arrangement is not limited thereto.

Figure 6:
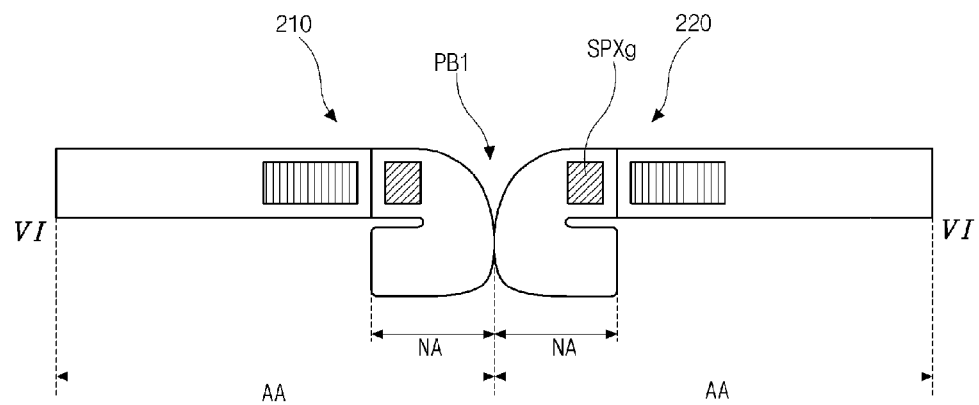
FIG. 6 is a cross-sectional view taken along line VI~VI' of FIG. 5 illustrating the OLED.

FIG. 6 is a cross-sectional view taken along line VI-VI' of FIG. 5 illustrating the OLED.

As illustrated in FIG. 6, the emission areas of the green sub-pixels SPXg formed in the different panels 210 and 220 with the first interpanel boundary PB1 interposed therebetween are smaller than those of the other sub-pixels. It is observed that the reduced emission area has a curved top surface caused by folding of the panel in the non-display area NA. When the green sub-pixels SPXg have the same emission area size, the emission device may be damaged at the region in which the top surface is curved. When the emission device is damaged, the corresponding pixel PX may be unable to emit light of desired gradation, and thus it may be difficult to implement a natural screen, and a problem with visibility may occur. Therefore, increasing the non-emission area at least by the area reduced by folding may decrease the damage of the emission area EA.

In some embodiments, a multiple display having 4 panels in which each panel is in contact with another panel at two sides may have outermost sub-pixels having even smaller emission areas than a multiple display having 2 panels in which one panel is in contact with the other panel at one side. In additional embodiments, a multiple display having more than 4 panels in which each panel is in contact with another panel at more than two sides may have outermost sub-pixels having even smaller emission areas than the multiple display having 4 panels.

Figure 7:
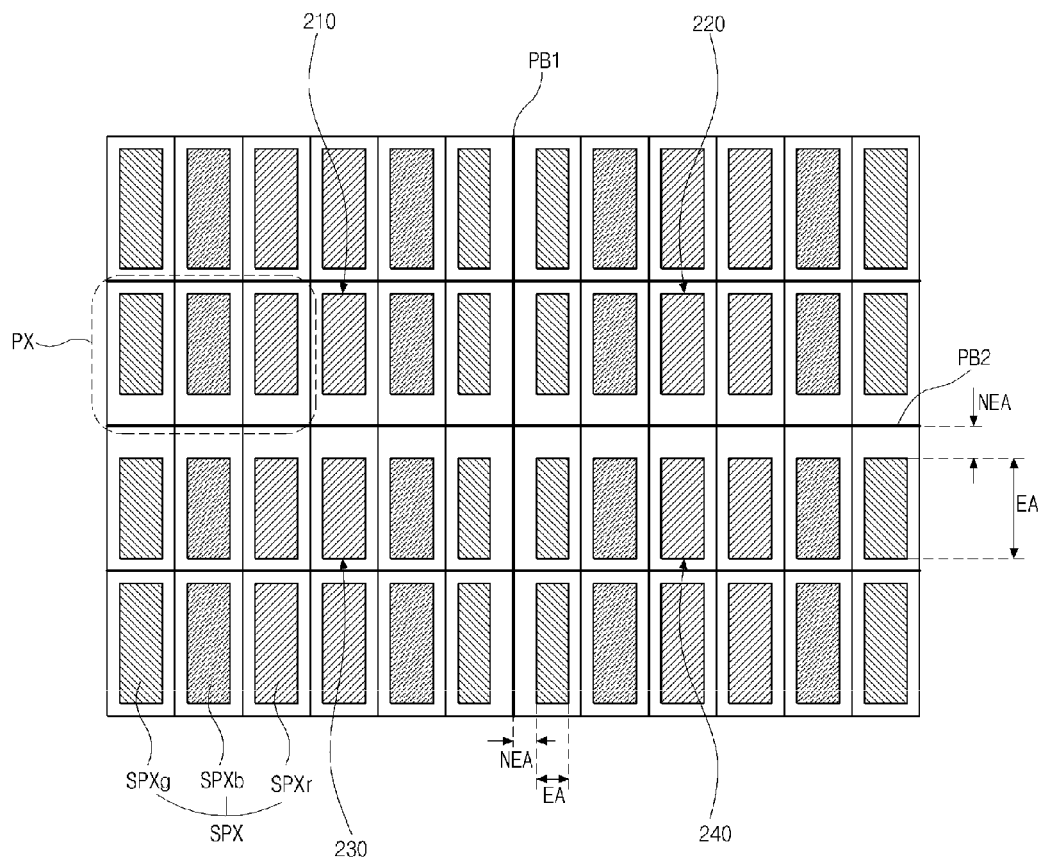
FIG. 7 is a plan view of locations of emission areas of adjacent sub-pixels formed in four different panels with non-display areas interposed therebetween according to another embodiment of the present invention.

FIG. 7 is a plan view of locations of emission areas of adjacent sub-pixels formed in four different panels with non-display areas interposed therebetween according to another embodiment of the present invention.

As illustrated in FIG. 7, in a multiple display 200, four panels 210, 220, 230 and 240 operate as a single multiple display. Four green sub-pixels SPXg disposed in the middle of the multiple display 200 that is in contact with both a first interpanel boundary PB1, and a second interpanel boundary PB2 have emission areas EA narrowed in vertical and horizontal directions, i.e., two directions compared with the emission areas EA of the other color sub-pixels SPXr and SPXb. In contrast, the emission areas of the red and blue sub-pixels SPXr and SPXb that are in contact with the second interpanel boundary PB2 are narrowed in a vertical direction, i.e., one direction. While the red and blue sub-pixels SPXr and SPXb exhibit lower light emission efficiency than the green sub-pixel SPXg, they have the emission area EA reduced in the vertical direction that is the longitudinal direction of the sub-pixel SPX, and thus the reduced area may not be significant. Therefore, life span and expression of gradation are not influenced.

FIGS. 8A to 8D illustrate a method of fabricating an OLED according to one embodiment of the present invention.

Figure 8A:
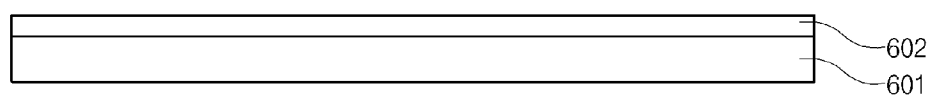
FIGS. 8A to 8D illustrate a method of fabricating an OLED according to another embodiment of the present invention.

As illustrated in FIG. 8A, a second substrate 602 is formed on a first substrate 601. The first substrate 601 may be formed of glass, or may be formed of any materials that may be separated through a subsequent lift-off process. The material constituting the second substrate 602 includes a flexible material (e.g. polyimide). Any material that can be bent as desired upon the fabrication in the subsequent process may be the material constituting the second substrate 602.

Figure 8B:
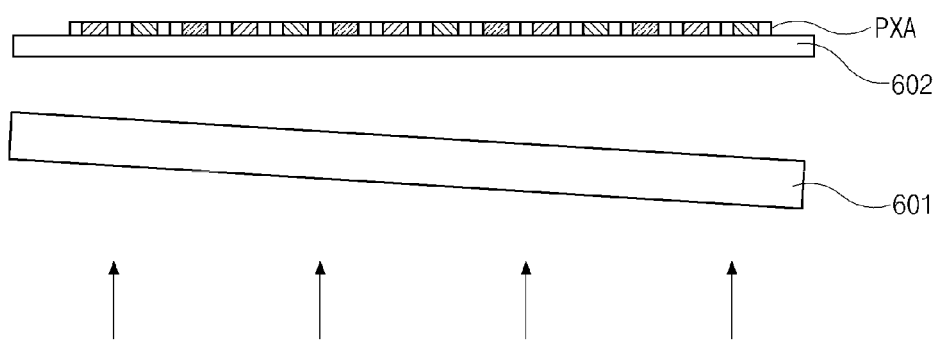

Next, as illustrated in FIG. 8B, a pixel part PXA is formed on a second substrate 602. The pixel part PXA may include a driving device, an emission device and an encapsulation part, which are sequentially formed.

The driving device may include a switching thin film transistor (not shown) and a driving thin film transistor (not shown), and at the same time, the gate line (not shown) and the data line (not shown) may be formed. The gate line may be formed of the same material as a gate electrode (not shown) of the thin film transistor, and the data line may be formed of the same material as source/drain electrodes (not shown) of the thin film transistor. While the gate electrode may be formed of a material containing molybdenum (Mo) and copper (Cu), it is not limited to these materials.

Also, the source/drain electrodes may be formed of a material containing copper (Cu), molybdenum (Mo) and aluminum (Al), or they may be formed of any other material exhibiting excellent conductivity without being limited to the above materials. Further, a power supply line (not shown), a gate pad part and a data pad part may be formed of the same material as the source/drain electrodes.

Next, an emission device formed of an organic material may be formed on the driving device. The emission device may include an anode (not shown), a cathode (not shown), a bank layer (not shown) and an organic emission layer (not shown). The OLED is classified as a top emission type or a bottom emission type depending on a light emission direction, and in the top emission-type OLED, the cathode is formed of the same transparent material as the anode. The material may include a transparent conductive oxide containing, but not limited to, indium tin oxide (ITO), indium zinc oxide (IZO), zinc oxide (ZO), and tin oxide (TO), for example. In the WRGB type, an organic emission layer may be formed on the entire surface of the substrate, and may be formed up to a non-display area NA when a separate mask shielding the non-display area NA is not used. In the RGB type, materials constituting an organic emission layer emitting each color may be separately deposited using a fine metal mask (FMM), which may prevent an organic material from being deposited on the non-display area NA.

In the sub-pixels of the outermost portions of the panels, the emission areas EA may be formed much smaller than the other portions of the panels. Therefore, the size and position of the emission areas EA may be adjusted in forming the emission device, and the adjusting method includes two methods of (i) adjusting the size of an organic emission layer and (ii) adjusting the position of a region of the anode and/or bank layer. As used herein, the region of the bank layer is the area where the bank layer is present.

Since the organic emission layer emits light only at a region in contact with the anode regardless of the formed area, the emission area may be adjusted by adjusting the anode area. Further, the bank layer may be formed on the organic emission layer to restrict an area from which light is emitted outside from the organic emission layer. However, this method may be applicable only to the top emission type.

As previously described, the organic emission layer, for example, may be formed in the WRGB type (e.g. a white emission organic emission layer may be deposited on the entire surface of a substrate), or in the RGB type in which organic material layers emitting red, green and blue are independently deposited. In the WRGB type, since the organic emission layer is formed on the entire surface of the substrate, a region in which the anode or bank layer is formed is adjusted to adjust an emission area. In the RGB type, as previously described, the emission area EA may be adjusted (i) by adjusting a region in which the anode or bank layer is formed or (ii) by adjusting the region in which the organic emission layer of each RGB color is formed.

However, when the organic emission layer of each RGB color is formed, a mask for deposition rather than exposure is used, and thus an emission area for each pixel can not be easily adjusted. Therefore, an exposure area of an anode or bank layer, the area of which may be adjusted, may be employed as an exposure mask using photolithography to reduce the area to be formed. The method of reducing the size of the emission area is not limited thereto.

The encapsulation part may be formed of an inorganic/organic multiple layered structure in which an inorganic material layer and an organic material layer are repeated or a multiple layered structure formed only of the same inorganic material layer or different inorganic material layers. Since the encapsulation part is formed on the entire surface of the substrate, it may be formed in the non-display areas NA. When an open mask shielding only the non-display areas is used, the encapsulation part may not be formed in the non-display areas NA or only the topmost part of the encapsulation part may extend to the non-display areas NA to protect an organic emission layer from moisture and air.

Next, a lift-off process is performed to separate the first substrate 601 from the second substrate 602. The lift-off process may be performed using laser light outside of the first substrate 601 to separate the first substrate 601 from the second substrate 602. The laser light may have a wavelength from 100 to 1200 nm, from 300 to 800 nm, from 500 to 1000 nm, or from 800 to 1000 nm. For easier separation, a sacrificial layer (not shown) may be formed between the first substrate 601 and the second substrate 602.

In some embodiments, an amorphous silicon film (a-Si film) may be used for the sacrificial layer. The a-Si film may contain hydrogen (H). In this case, the content of hydrogen may be 2 at % or higher or 2 to 20 at %. When a predetermined content of hydrogen is contained, radiation of the laser light causes the hydrogen to be emitted, the sacrificial layer to build an internal pressure, and thin films contacting the sacrificial layer may be exfoliated. The content of hydrogen in amorphous silicon may be adjusted by appropriately setting conditions of forming a layer, e.g., gas compositions in the CVD, gas pressure, gas atmosphere, gas flow rate, temperature, substrate temperature, and injection power.

Figure 8C:
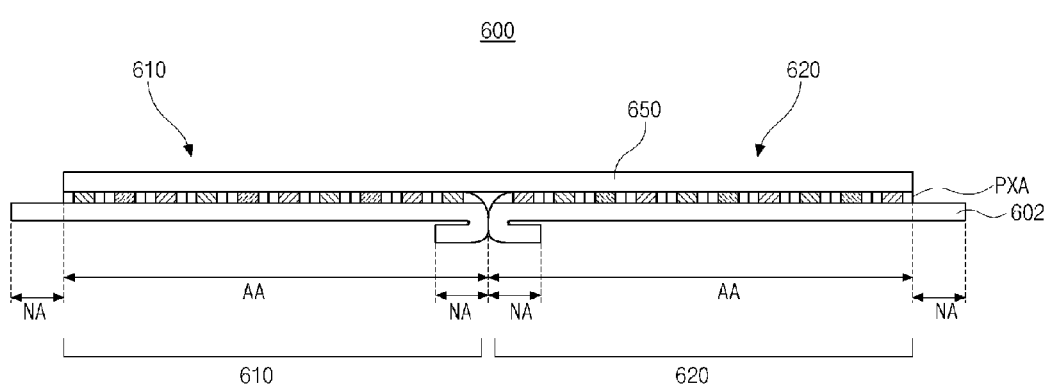

Afterwards, as illustrated in FIG. 8C, a polarizing plate 650 is attached while the non-display areas NA of both panels 610 and 620 are folded to be in contact with each other. Here, the panel in the non-display areas NA may be vertically folded to be in contact with each other, and may be folded at various angles at which adhesive force is maximized. Here, a direction in which the areas are folded may be opposite to the polarizing plate 650. In this instance, a pad part (not shown), which is connected to an outer driving circuit, is formed in the non-display region NA such that the pad part is also folded.

An adhesive may be coated between the non-display areas NA that are in contact with each other to improve the adhesive force of the panels 610 and 620. The adhesive may be a transparent material. The panels in the non-display areas NA that are not in contact with each other may be folded to be in contact with lower parts of the panels 610 and 620.

Figure 8D:
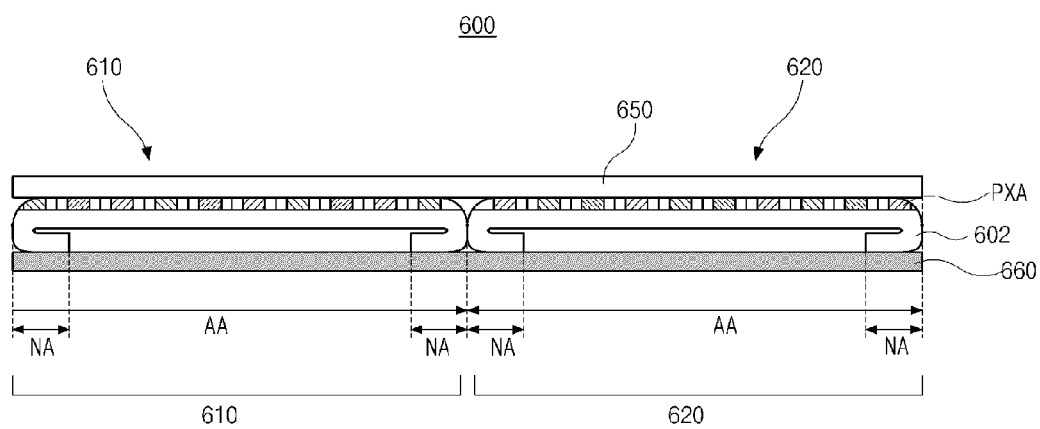

Then, as illustrated in FIG. 8D, a support part 660 may be formed at a lower part of the multiple display 600. The support part 660 may be attached to the folded panels in the non-display areas NA, and may be attached using a transparent adhesive described herein. The support part 660 may be formed of the same material (e.g. polyimide) as the substrate, but is not limited thereto. When the multiple display 600 is not flexible, various materials enhancing adhesion of the multiple display 600 and capable of functioning as a protection layer invulnerable to moisture and air (e.g. glass or stainless) may be used.

According to the present invention, non-display areas formed in a plurality of panels may be attached by folding the panels in the non-display areas to be in contact with each other, so that a screen of a large-area OLED can be continuously implemented without cut off.

Also, a support member may be connected to a lower part of a panel adjacent to the OLED including a plurality of panels to improve bonding force between the panels.

In addition, emission areas of pixels formed in a region in contact with the panels may be reduced to minimize damage of the emission areas of the pixels, which can be caused when the panels in the non-display areas are folded.

It will be apparent to those skilled in the art that various modifications and variations can be made in a display device of the present disclosure without departing from the spirit or scope of the invention. Thus, it is intended that the present invention cover the modifications and variations of this invention provided they come within the scope of the appended claims and their equivalents.

What is claimed is:

1. An organic light emitting display device (OLED), comprising:
   a multiple display in which a plurality of panels operate as a single display, each of the panels comprising a substrate and a pixel; and
   a polarizing plate attached to the multiple display to bond the plurality of panels as a single panel,
   wherein the panels are divided into:
     display areas in which pixels are formed, and
     non-display areas surrounding the display areas,
   wherein at least two adjacent panels at an interpanel boundary comprise a folded portion in the adjacent non-display areas to reduce the non-display areas,
   wherein the pixel comprises sub-pixels, and
   wherein each panel comprises at least one sub-pixel in the non-display area in the interpanel boundary over the folded portion of the respective panel.

2. The OLED according to claim 1, wherein ends of the folded panels in the adjacent non-display areas are in contact with a lower part of each of the corresponding panels.

3. The OLED according to claim 1, wherein:
   the sub-pixels comprise different colors and different materials; and
   the sub-pixels of the outermost portions of the at least two adjacent panels at the interpanel boundary have the same color of the most superior brightness.

4. The OLED according to claim 1, wherein:
   the sub-pixels comprise different colors;
   each of the sub-pixels comprises an emission area; and
   the emission areas in the sub-pixels of the outermost portions of the at least two adjacent panels are smaller than those in the other sub-pixels in the pixel.

5. The OLED according to claim 1, wherein:
   the sub-pixels comprise different colors;
   each of the sub-pixels comprises an emission area; and
   the emission areas in the sub-pixels of the outermost portions of the at least two adjacent panels are shifted to the opposite side of the interpanel boundary compared to the emission areas of the other sub-pixels in the pixel.

6. The OLED according to claim 5, wherein:
   each of the sub-pixels comprises an anode and a bank layer; and
   the anodes and/or bank layers in the sub-pixels of the outermost portions of the at least two adjacent panels are shifted to the opposite side of the interpanel boundary compared to those in the other sub-pixels in the pixel.

7. The OLED according to claim 1, further comprising:
   a support part formed at lower part of the multiple display, wherein the support part connects at least two adjacent panels at an interpanel boundary.

8. The OLED according to claim 1, wherein:
   the multiple display comprises at least four panels;
   each of the panels has two interpanel boundaries with two different panels; and
   the panels at each of the interpanel boundaries are folded in the adjacent non-display areas to reduce the non-display areas.

9. The OLED according to claim 1, wherein the pixel comprises sub-pixels of red, green, and blue.

10. The OLED according to claim 1, wherein the pixel comprises sub-pixels of white, red, green, and blue.

11. A method of fabricating an organic light emitting display device (OLED), the method comprising:
    providing a plurality of second substrates on a first substrate;
    dividing each of the second substrates into display areas and non-display areas surrounding the display areas;
    providing a plurality of pixels including sub-pixels in the display areas to form a panel;
    providing a folded portion in at least two adjacent panels at an interpanel boundary in the adjacent non-display areas to reduce the non-display areas;
    coupling a polarizing plate to the plurality of panels to form a multiple display,
    wherein the pixel comprises sub-pixels, and
    wherein providing each panel comprises forming at least one sub-pixel in the non-display area in the interpanel boundary over the folded portion of the respective panel.

12. The method according to claim 11, wherein ends of the folded panels in the adjacent non-display areas are in contact with a lower part of each of the corresponding panels.

13. The method according to claim 11, wherein:
    the sub-pixels comprise different colors and different materials; and
    the sub-pixels of the outermost portions of the at least two adjacent panels at the interpanel boundary have the same color of the most superior brightness.

14. The method according to claim 11, wherein:
    the sub-pixels comprise different colors;
    each of the sub-pixels comprises an emission area; and
    the emission areas in the sub-pixels of the outermost portions of the at least two adjacent panels are smaller than those in the other sub-pixels in the pixel.

15. The method according to claim 11, wherein:
the sub-pixels comprise different colors;
each of the sub-pixels comprises an emission area; and
the emission areas in the sub-pixels of the outermost portions of the at least two adjacent panels are shifted to the opposite side of the interpanel boundary compared to the emission areas of the other sub-pixels in the pixel.

16. The method according to claim 15, wherein:
each of the sub-pixels comprises an anode and a bank layer; and
the anodes and/or bank layers in the sub-pixels of the outermost portions of the at least two adjacent panels are shifted to the opposite side of the interpanel boundary compared to those in the other sub-pixels in the pixel.

17. The method according to claim 11, wherein:
the OLED comprises a support part formed at lower part of the multiple display; and
the support part connects at least two adjacent panels at an interpanel boundary.

18. The method according to claim 11, wherein:
the multiple display comprises at least four panels;
each of the panels has two interpanel boundaries with two different panels; and
the panels at each of the interpanel boundaries are folded in the adjacent non-display areas to reduce the non-display areas.

19. The method according to claim 11, wherein the pixel comprises sub-pixels of red, green, and blue.

20. The method according to claim 11, wherein the pixel comprises sub-pixels of white, red, green, and blue.

* * * * *